United States Patent [19]

Taniguchi et al.

[11] Patent Number: 5,177,577
[45] Date of Patent: Jan. 5, 1993

[54] LIQUID CRYSTAL DISPLAY DEVICE WITH TFT'S EACH INCLUDING A TA GATE ELECTRODE AND AN ANODIZED AL OXIDE FILM

[75] Inventors: Hideaki Taniguchi; Kazuo Shirahashi; Yuka Matsukawa, all of Mobara; Haruo Matsumaru; Akira Sasano, both of Tokyo, all of Japan

[73] Assignee: Hitachi, Ltd., Tokyo, Japan

[21] Appl. No.: 726,404

[22] Filed: Jul. 5, 1991

[30] Foreign Application Priority Data

Jul. 5, 1990 [JP] Japan .................. 2-176352
Jul. 5, 1990 [JP] Japan .................. 2-176352

[51] Int. Cl.$^5$ ............... H01L 27/01; H01L 29/78; H01L 27/12
[52] U.S. Cl. ........................... 257/59; 252/72; 252/761

[58] Field of Search ............... 357/23.7, 23.15, 23.1, 357/4, 71

[56] References Cited

U.S. PATENT DOCUMENTS 4,469,568 9/1984 Kato et al. ............ 357/23.15
5,032,536 7/1991 Oritsuki et al. ........ 357/23.7
5,036,370 7/1991 Miyago et al. ............ 357/4

Primary Examiner—Rolf Hille
Assistant Examiner—Wael Fahmy
Attorney, Agent, or Firm—Antonelli, Terry, Stout & Kraus

[57] ABSTRACT

An active matrix liquid crystal display device with a plurality of thin-film transistors each including a gate electrode of an upper aluminum film and a lower tantalum film formed over a glass substrate and a gate insulator of an upper silicon nitride film and a lower anodized oxide film of the aluminum film.

13 Claims, 16 Drawing Sheets

Back Light

LIQUID CRYSTAL DISPLAY DEVICE WITH TFT'S EACH INCLUDING A TA GATE ELECTRODE AND AN ANODIZED AL OXIDE FILM

BACKGROUND OF THE INVENTION

The present invention relates to a thin film transistor and, more particularly, to a thin film transistor to be used in a liquid crystal display circuit of active matrix type.

The liquid crystal display circuit of active matrix type is equipped with nonlinear elements (e.g., switching elements) individually corresponding to a plurality of pixel electrodes arrayed in a matrix form. Since the liquid crystal in each pixel is theoretically driven (at a duty ratio of 1.0) at all times, the time sharing drive method is adopted. As compared with the so-called "simple matrix method", the active method has an excellent contrast and is becoming a technology indispensable in the color field. The switching elements are represented by thin film transistors (TFT).

In the thin film transistor (disclosed in Japanese Patent Laid-Open No. 35421/1989) used in the conventional liquid crystal circuit of active matrix type, a gate electrode made of aluminum (Al) is formed over a glass substrate, and an anodized film ($Ta_2O_5$) of tantalum is sandwiched between a gate insulating film formed over the gate electrode and the gate electrode.

In this thin film transistor, however, the adhesion of the aluminum to the glass is not satisfactory, and the gate electrode may be damaged. Since, moreover, the breakdown voltage of the anodized film of the tantalum is low, the gate electrode and the source electrode or the drain electrode may be shorted.

SUMMARY OF THE INVENTION

The present invention has been conceived to solve the above-specified problems and has an object to provide a thin film transistor which is freed from having its gate electrode damaged and from having its gate electrode and source electrode or drain electrode shorted.

In order to solve this object, according to the present invention, a gate electrode of tantalum is formed over a transparent substrate made of a glass material. A semiconductor layer is formed over the aforementioned gate electrode. A layer of an aluminum oxide is sandwiched between the aforementioned semiconductor layer and gate electrode.

In this thin film transistor, the adhesion of the tantalum to the glass substrate is excellent, and the aluminum oxide has a high breakdown voltage.

DESCRIPTION OF THE PREFERRED EMBODIMENTS

Figure 1A:
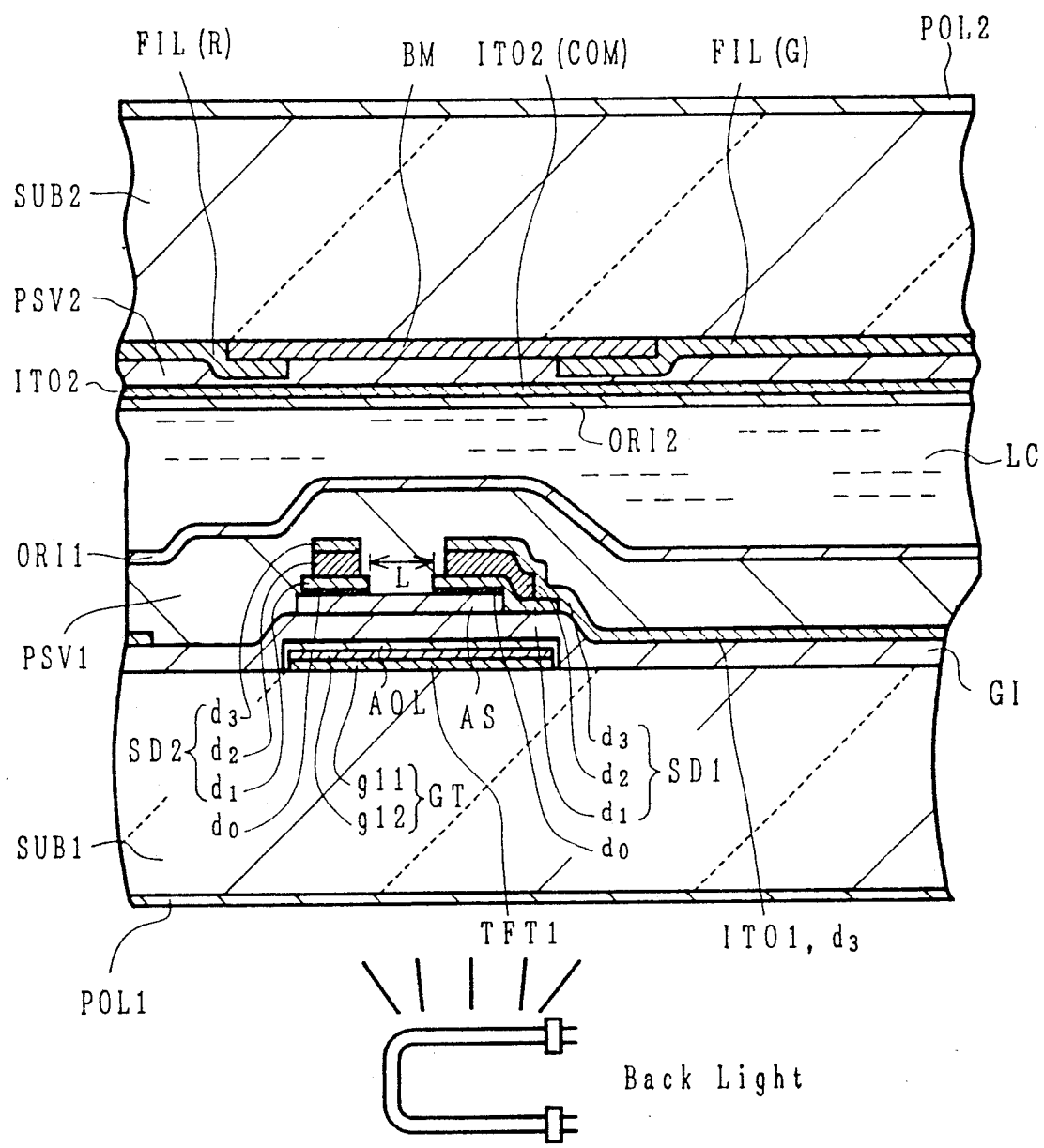
FIG. 1A is a section taken along line 1A—1A from FIG. 1D.

Here will be described in the following a color liquid crystal display circuit of active matrix type, to which the present invention is to be applied.

Incidentally, the parts having identical functions are designated using identical reference characters throughout all the FIGS. for describing the liquid crystal display circuit, and their repeated descriptions will be omitted.

Figure 2A:
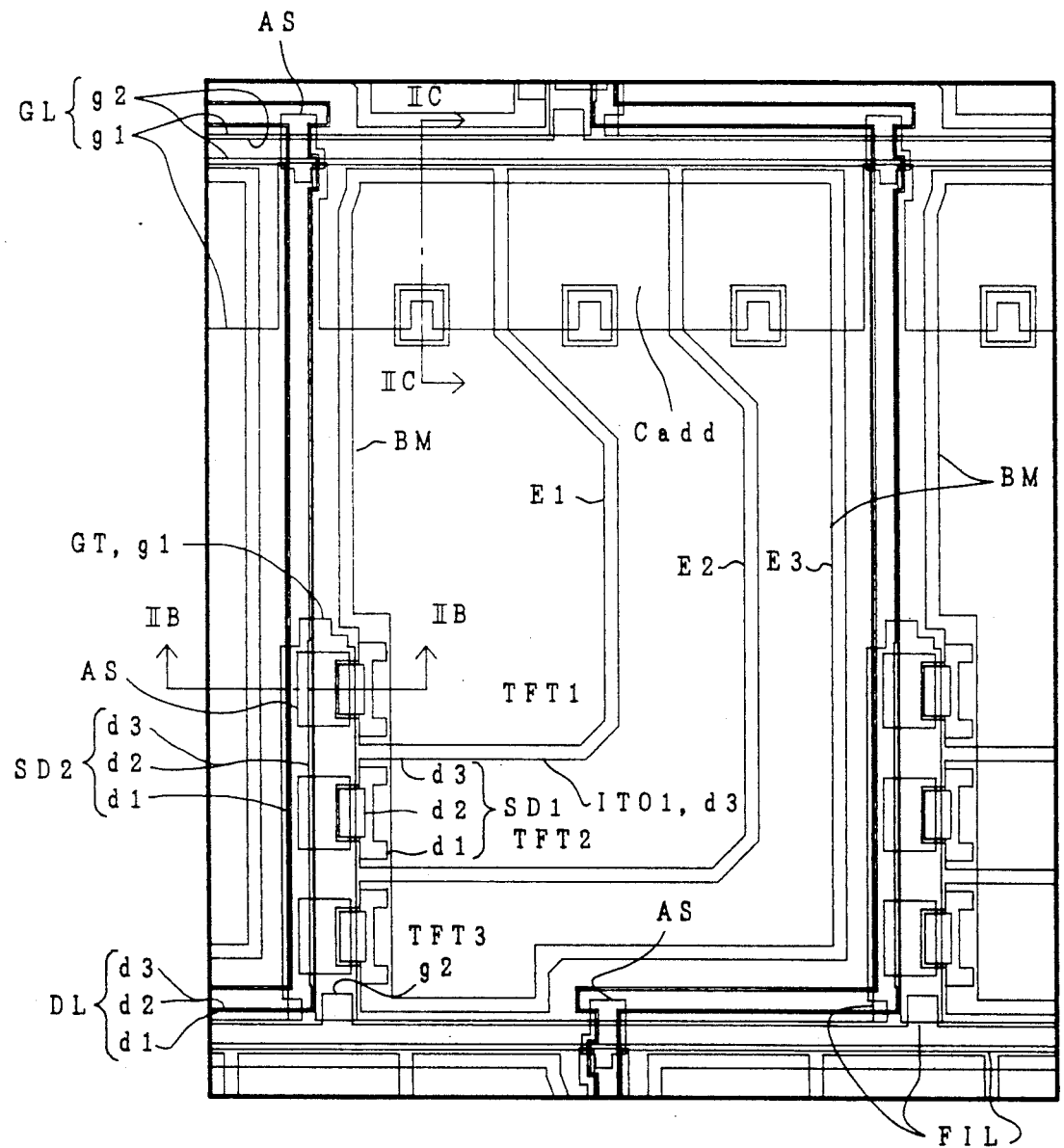
FIG. 2A is a top plan view showing an essential portion of one pixel of the liquid crystal display of the color liquid crystal display circuit of active matrix type, to which the present invention is to be applied.
Figure 2B:
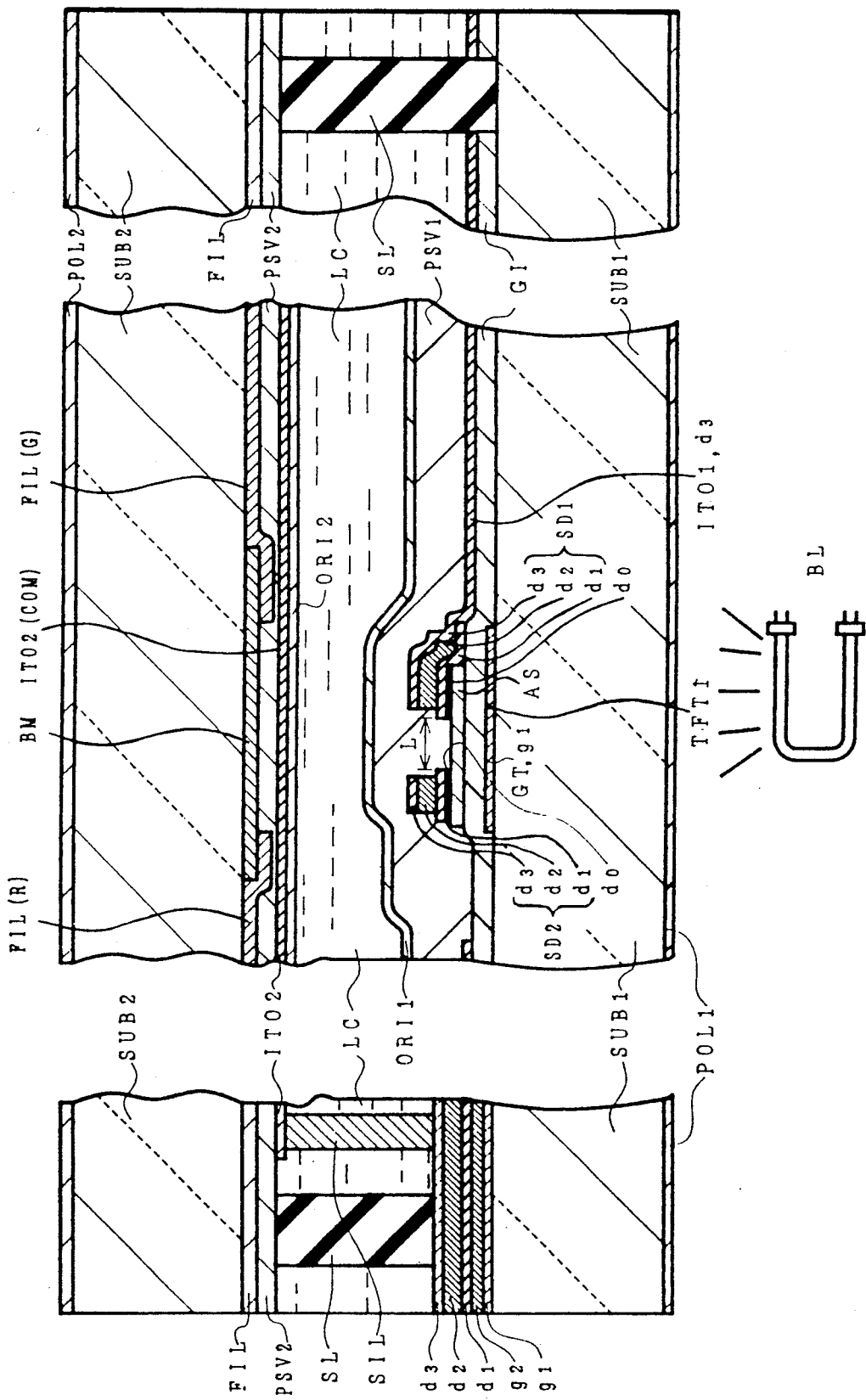
FIG. 2B is a section taken along line IIB—IIB of FIG. 2A and showing a peripheral portion of the seal portion.
Figure 2C:
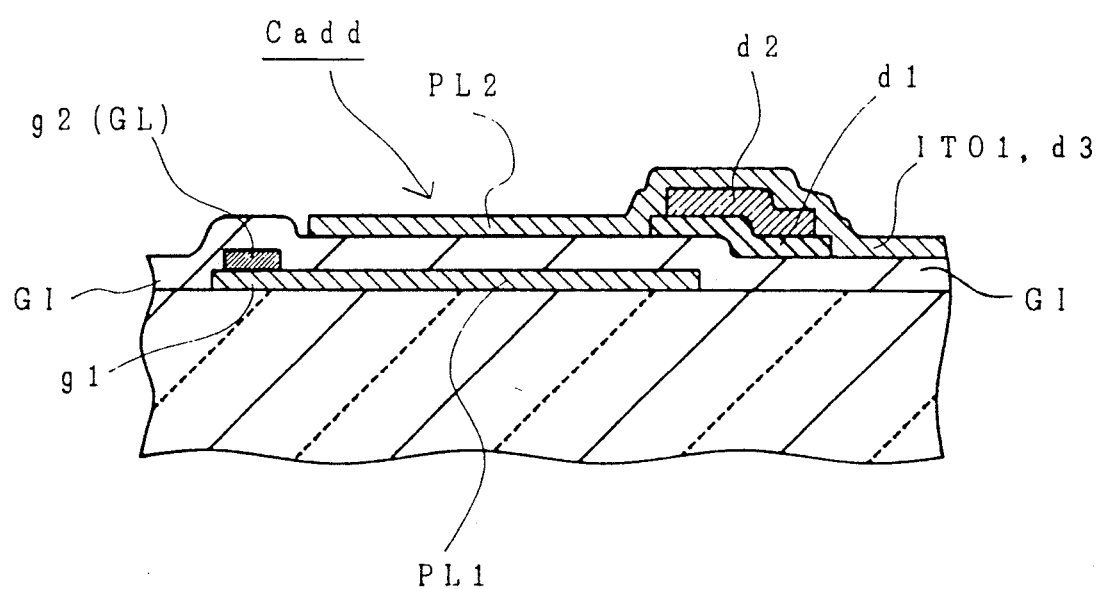
FIG. 2C is a section taken along line IIC—IIC of FIG. 2A.
Figure 3:
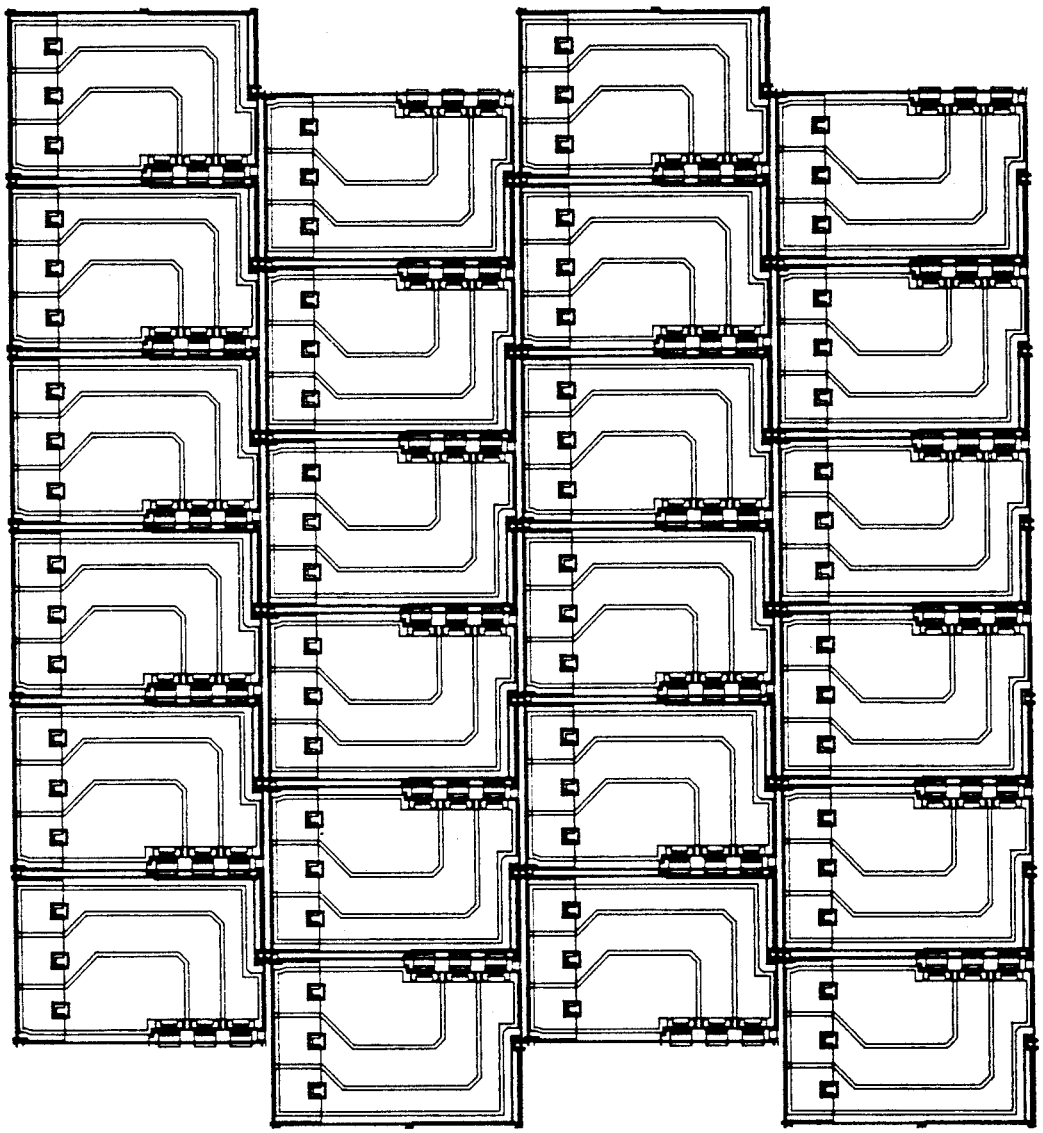
FIG. 3 is a top plan view showing an essential portion of a liquid crystal display circuit arranged with a plurality of pixels shown in FIG. 2A.

FIG. 2A is a top plan view showing one embodiment of one pixel and its peripheral portion of the active matrix type color liquid crystal display circuit to which the present invention is to be applied. FIG. 2B is a section taken along line IIB—IIB of FIG. 2A and shows the embodiment and the vicinity of the sealing portion of the display panel. FIG. 2C is a section taken along IIC—IIC of FIG. 2A and shows the embodiment. On the other hand, FIG. 3 (showing an essential portion is a top plan view) is a top plan view showing one embodiment in the case of a number of pixels of the type shown in FIG. 2A are arranged.

Pixel Arrangement

As shown in FIG. 2A, each pixel is arranged in a cross region (defined by four signal lines, i.e., two operation signal lines and two video signal lines) between two adjacent operation signal lines (e.g., gate signal lines or horizontal signal lines) GL and two video signal lines (e.g., drain signal lines or vertical signal lines) DL. Each pixel includes a thin film transistor TFT, a pixel electrode ITO1 and an additional capacitor Cadd. The scanning signal lines GL are extended in the column direction and arranged in plurality in the row direction. The video signal lines DL are extended in the row direction and arranged in plurality in the column direction.

Overall structure of Panel Section

As shown in FIG. 2B, the thin film transistor TFT and the transparent pixel electrode ITO1 are formed at the side of a lower transparent glass substrate SUB1 across a liquid crystal layer LC, and a color film FIL and a black matrix pattern BM for light shielding are formed at the side of an upper transparent glass substrate SUB2. The side of the lower transparent glass substrate SUB1 is made to have a thickness of about 1.1 (mm), for example.

FIG. 2B presents a section of one pixel portion at its center and a section of the portion, i.e., the lefthand side edges of the transparent glass substrates SUB1 and SUB2, in which the external leading-out wires are present, at its lefthand side. The righthand side presents a section of a portion, i.e., the righthand side edges of the transparent glass substrates SUB1 and SUB2, in which the leading-out wires are absent.

Sealing members SL, as indicated at the lefthand and righthand sides of FIG. 2B, are made to seal up the liquid crystal LC and are formed along the whole edges of the transparent glass substrates SUB1 and SUB2 excepting the liquid crystal sealing port (although not shown). The sealing members SL are made of an epoxy resin, for example.

A common transparent pixel electrode ITO2 at the side of the aforementioned upper transparent glass substrate SUB2 has its at least one portion connected with the external leading-out wire, which is formed at the side of the lower transparent glass substrate SUB1, by means of silver paste SIL. This leading-out wire is formed at the fabrication step shared with the aforementioned gate electrode GT, source electrode SD1 and drain electrode SD2.

The individual layers of alignment films OR11 and OR12, transparent pixel electrode ITO1, common transparent pixel electrode ITO2, passivation films PSV1 and PSV2 and insulating film GI are formed inside of the sealing member SL. Polarizers POL1 and POL2 are formed on the individual outer surfaces of the lower transparent glass substrate SUB1 and the upper transparent glass substrate SUB2.

A liquid crystal LC is filled between the lower alignment film OR11 and upper alignment film OR12 for setting the orientations of the liquid crystal molecules and is sealed with the sealing member SL.

The lower alignment film OR11 is formed over the passivation film PSV1 at the side of the lower transparent glass substrate SUB1.

On the surface of the inside (at the liquid crystal side) of the upper transparent glass substrate SUB2, there are sequentially laminated a shielding film BM, a color filter FIL, a passivation film PSV2, a common transparent pixel electrode (COM) ITO2 and an upper alignment film ORI2.

This liquid crystal display circuit is assembled by forming the individual layers at the sides of the lower transparent glass substrate SUB1 and the upper transparent glass substrate SUB2, by subsequently superposing the upper and lower transparent glass substrates SUB1 and SUB2, and by filling the liquid crystal LC between the two.

Thin Film Transistor TFT

If a positive bias is applied to the gate electrode GT, the thin film transistor TFT has its channel resistance reduced between its source and drain. If the bias is reduced to zero, the thin film transistor TFT operates to have its channel resistance increased.

The thin film transistor TFT of each pixel is divided into three (or plurality) in the pixel so that it is composed of thin film transistors (or divided thin film transistors) TFT1, TFT2 and TFT3. These thin film transistors TFT1 to TFT3 are individually made to have a substantially equal size (in the channel length and width). Each of these divided thin film transistors TFT1 to TFT3 is composed mainly of a gate electrode GT, a gate insulating film GI, an i-type (i.e., intrinsic type not doped with a conductivity type determining impurity) amorphous Si semiconductor layer AS, and a pair of source electrode SD1 and drain electrode SD2. Incidentally, the source and drain are intrinsically determined in dependence upon the bias polarity inbetween, and this polarity is inverted during the operation in the circuit of the present display circuit. Thus, it should be understood that the source and drain are interchanged during the operation. In the following description, however, one is fixed as the source whereas the other is fixed as the drain, for conveniences only.

Gate Electrode GT

Figure 4:
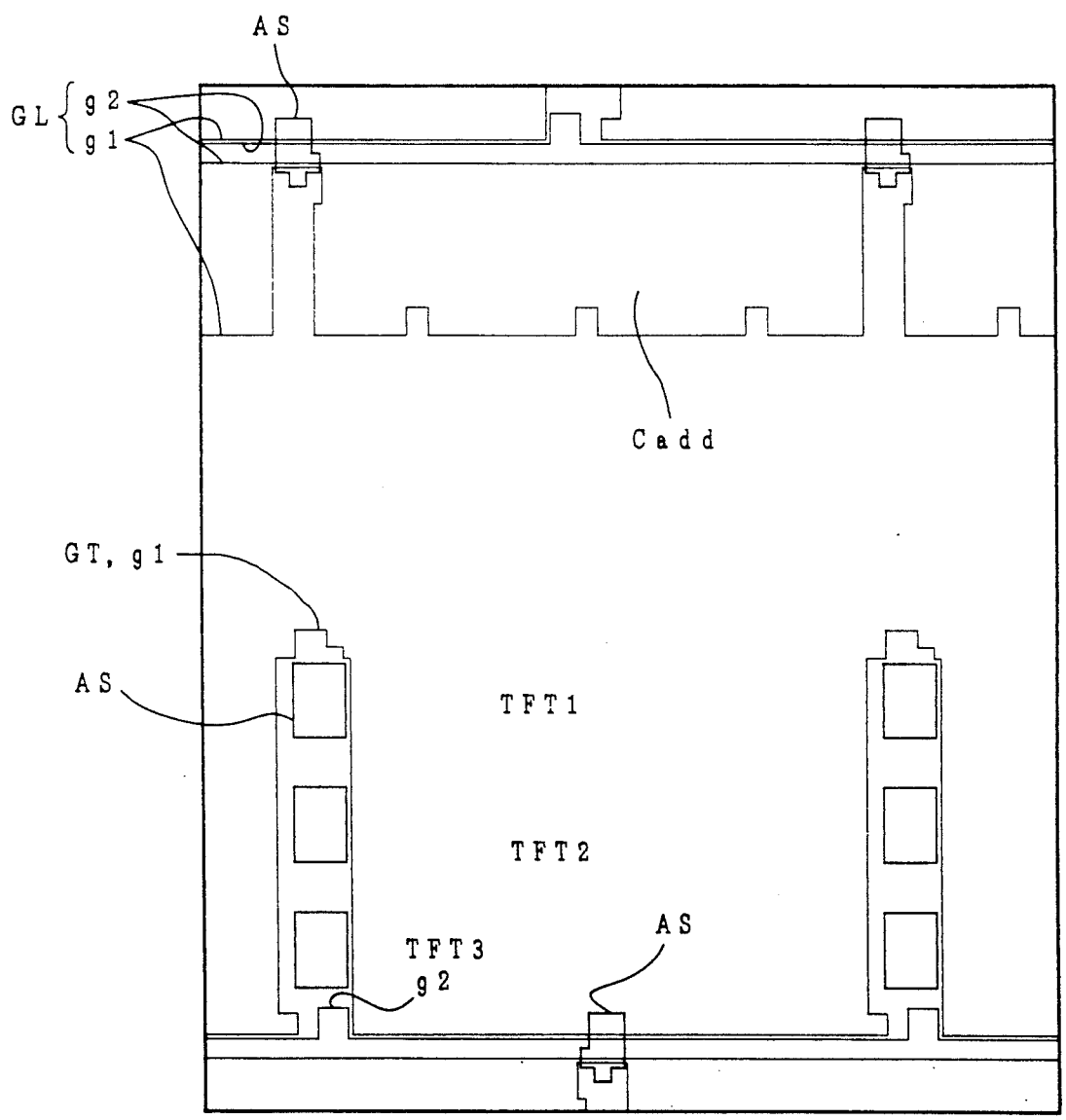
FIGS. 4 to 6 are top plan views showing only predetermined layers of the pixels shown in FIG. 2A.

The gate electrode GT is formed to project perpendicularly (i.e., upward, as viewed in FIGS. 2A and 4) from the scanning signal lines GL (or branched in the "T-shape"), as shown in detail in FIG. 4 (presenting a top plan view showing the layers g1, g2 and AS of FIG. 2A only). The gate electrode GT is extended to the regions to be individually formed with the thin film transistors TFT1 to TFT3. These thin film transistors TFT1 to TFT3 have their individual gate electrodes GT integrated (as their common gate electrode) to merge into the scanning signal line GL. The gate electrode GT is formed of a single-layered first conductive film g1 so that no high step may be formed in the regions to be formed with the thin film transistors TFT. This first conductive film g1 is made of a sputtered chromium (Cr) film, for example, to have a thickness as small as about 1,000 angstroms.

This gate electrode GT is made so slightly large as to cover the semiconductor layer AS completely (as viewed upward), as shown in FIGS. 2A and 2B and FIG. 4. In case, therefore, a back light BL such as a fluorescent lamp is attached to the bottom of the substrate SUB1, this opaque Cr gate electrode GT establishes a shadow to shield the semiconductor layer AS from the back light, thus substantially eliminating the conducting phenomenon due to the optical irradiation, i.e., the deterioration off the OF characteristics of the TFTs. Here, the intrinsic size of the gate electrode GT is given the least necessary width (including the positioning allowance of the gate electrode of the source/drain electrodes) for extending between the source/drain electrodes SD1 and SD2. The depth for determining that channel width W is determined in dependence upon the factor W/L determining the mutual conductance gm, i.e., the ratio to the distance (i.e., the channel length) L between the source/drain electrodes.

The size of the gate electrode in the present embodiment is naturally made larger than the aforementioned intrinsic size.

The gate electrode GT and its wiring line GL may be integrally formed of a single layer if considered from the gating and shielding functions of the gate electrode GT. In this case, the opaque conductive material to be selected can be exemplified by Al containing Si, pure Al, or Al containing Pd.

Scanning Signal Line GL

The aforementioned scanning signal line GL is formed of a composite film which is composed of the first conductive film gl and the second conductive film g2 formed over the former. The first conductive film gl of the scanning signal line GL is formed at the same step and integrally with the first conductive film of the aforementioned gate electrode GT. The second conductive film g2 is formed of a sputtered aluminum (Al), for example, to have a thickness of about 1,000 to 5,500 angstroms. The second conductive film g2 is formed to reduce the resistance of the scanning signal line GL thereby to speed up the signal transmission rate (or to improve the information writing characteristics of the pixel).

Moreover, the scanning signal line GL has its second conductive film g2 made to have a smaller width than that of the first conductive film gl. In other words, the scanning signal line GL has a gentle step at its side wall.

Gate Insulating Film GI

The insulating film GI is used as the individual gate insulating films of the thin film transistors TFT1 to TFT3. The insulating film GI is formed over the gate electrode GT and the scanning signal line GL. The insulating film GI is formed of a silicon nitride film prepared by the plasma CVD, for example, to have a thickness of about 3,000 angstroms.

i-Type Semiconductor Layer AS

The i-type semiconductor layer AS is used as the individual channel forming regions of the thin film transistors TFT1 to TFT3 divided into a plurality of parts, as shown in FIG. 4. The i-type semiconductor layer AS is formed of an amorphous silicon film or polycrystalline silicon film to have a thickness of about 1,800 angstroms.

This i-type semiconductor layer AS is formed subsequent to the formation of the $Si_3N_4$ gate insulating film GI by changing the components of supply gases but by using the common plasma CVD system such that it is not exposed from the system to the outside. On the other hand, an $N^+$-type layer d0 (shown in FIG. 2B) doped with P for the ohmic contact is likewise formed subsequently to have a thickness of about 400 angstroms. After this, the lower substrate SUB1 is taken out of the CVD system, and the $N^+$-type layer d0 and the i-type AS are patterned into independent islands by the photographic technology, as shown in FIGS. 2A and 2B.

The i-type semiconductor layer AS is also formed between the intersecting portions (or crossover portions) of the scanning signal line GL and the video signal line DL, as shown in detail in FIG. 2A and FIG. 4. This cross over i-type semiconductor layer AS is formed to reduce the short-circuiting between the scanning signal line GL and the video signal line DL at the intersecting portion.

Source/Drain Electrodes SD1 and SD2

Figure 5:
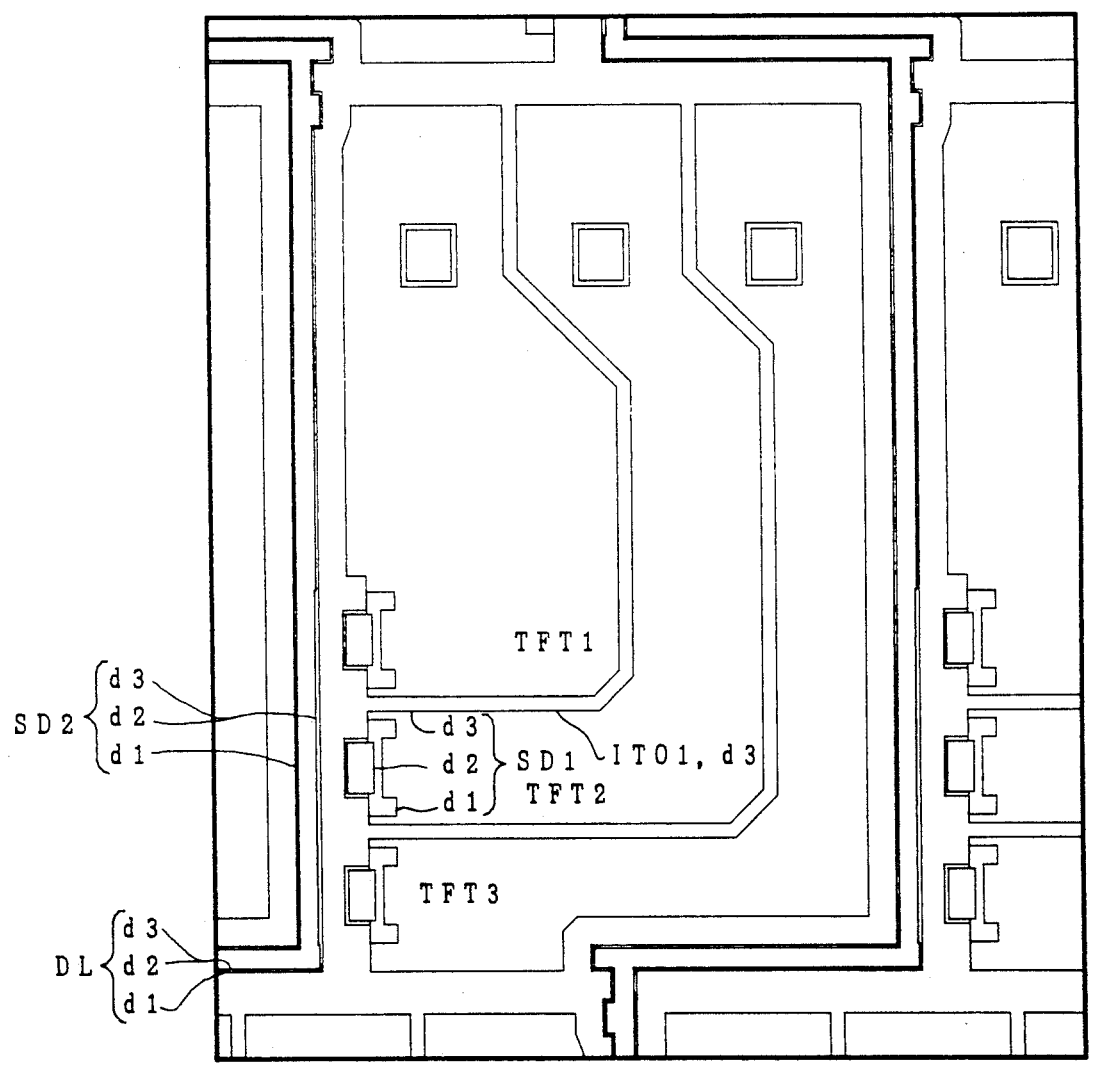

The individual source electrodes SD1 and drain electrodes SD2 of the divided thin film transistors TFT1 to TFT3 are formed over the semiconductor layer AS and separately from each other, as shown in detail in FIGS. 2A and 2B and in FIG. 5 (presenting a top plan view showing the layers d1 to d3 of FIG. 2A only).

Each of the source electrode SD1 and the drain electrode SD2 is formed by overlaying a first conductive film d1, a second conductive film d2 and a third conductive film d3 sequentially from the lower side contacting with the $N^+$-type semiconductor layer d0. The first conductive film d1, second conductive film d2 and third conductive film d3 of the source electrode SD1 are formed at the same fabrication step as those of the drain electrode SD2.

The first conductive film d1 is formed of a sputtered chromium film to have a thickness of 500 to 1,000 angstroms [e.g., about 600 angstroms in the present embodiment]. The chromium film is formed to have a thickness no more than 2,000 angstroms because it establishes a high stress if it is made excessively thick. The chromium film has an excellent contact with the $N^+$-type semiconductor layer d0. The first conductive film d1 may be made of not only the aforementioned chromium film but also a refractory metal (e.g., Mo, Ti, Ta or W) film or its silicide (e.g., $MoSi_2$, $TiSi_2$, $TaSi_2$ or $WSi_2$).

After the first conductive film d1 has been patterned with the photography, the $N^+$-type laser d0 is removed by using the same photographic mask or the first conductive film d1. Specifically, the $N^+$-type layer d0 left on the i-th layer AS is removed in self-alignment while leaving the first conductive film d1 as it is. Since, at this time, the $N^+$-type layer d0 is etched to remove its whole thickness, the i-th layer AS is slightly etched off at its surface portion, but this removal may be controlled by the etching period.

After this, the second conductive film d2 is formed of sputtered aluminum to have a thickness of 3,000 to 5,500 angstroms [e.g., about 3,500 angstroms in the present embodiment]. The aluminum layer is less stressed than the chromium layer so that it can be formed to have larger thickness thereby to reduce the resistances of the source electrode SD1, the drain electrode SD2 and the video signal line DL. The second conductive film d2 may be formed of not only the aluminum film but also an aluminum film containing silicon (Si) or copper (Cu) as an additive.

After the second conductive film d2 has been patterned by the photographic technology, the third conductive film d3 is formed. This third conductive film d3 is formed of a sputtered transparent conductive film (e.g., ITO, i.e., Indium-Tin-Oxide: NESA film) to have a thickness of 1,000 to 2,000 angstroms [about 1,200 angstroms in the present embodiment]. This third conductive film d3 constitutes not only the source electrode SD1, the drain electrode SD2 and the video signal line DL but also the transparent pixel electrode ITO1.

Each of the first conductive film d1 of the source electrode SD1 and the first conductive film d1 of the drain electrode SD2 is internally (i.e., into the channel region) turned more deeply than the upper lying second conductive film d2 and third conductive film d3. In other words, the first conductive films d1 in those portions is enabled to regulate (define) the gate length L of the thin film transistor TFT independently of the layers d2 and d3.

The source electrode SD1 is connected with the transparent pixel electrode ITO1, as has been described hereinbefore. The source electrode SD1 is formed along the stepped shape (i.e., the step corresponding to the sum of the thicknesses of the first conductive film d1, the N⁻-type layer d0 and the i-type semiconductor layer AS) of the i-type semiconductor layer AS.

More specifically, the source electrode SD1 is composed of: the first conductive film d1 formed along the stepped shape of the i-type semiconductor layer AS, the second conductive film d2 formed over the first conductive film d1 but sized smaller than the first conductive film d1 at its side to be connected with the transparent pixel electrode ITO1, and the third conductive film d3 connected with the portion of the first conductive film d1 exposed to the outside from the second conductive film d2.

This second conductive film d2 of the source electrode SD1 is formed to ride over the i-type semiconductor layer AS because the chromium film of the first conductive film d1 cannot be made so thick because of the increase in the stress as to ride over the stepped shape of the i-type semiconductor layer AS. In short, the second conductive film d2 is made thick to improve the step coverage. The second conductive film d2 can be made thick so that it can highly contribute to the reduction of the resistance of the source electrode SD1 (as well as those of the drain electrode SD2 and the video signal line DL).

The third conductive film d3 is connected with the first conductive film d1, which is exposed to the outside by reducing the size of the second conductive film d2, because it cannot ride over the stepped shape made by the i-type semiconductor layer AS of the second conductive film d2. The first conductive film d1 and the third conductive film d3 cannot only have an excellent adherence but also ensure the connections because their connected portions have a small step.

Pixel Electrode ITO1

The aforementioned transparent pixel electrode ITO1 is provided for each pixel and constitutes one of the pixel electrodes of the liquid crystal display. The transparent pixel electrode ITO1 is divided into three transparent pixel electrodes (i.e., divided transparent pixel electrodes) E1, E2 and E3 corresponding to the thin film transistors TFT1 to TFT3 which are divided for the plural pixels). Each of the transparent pixel electrodes E1 to E3 is connected with the source electrode SD1 of the thin film transistor TFT.

Each of the transparent pixel electrodes E1 to E3 is patterned to have a substantially equal area.

Thus, the thin film transistor TFT of one pixel is divided into the plural thin film transistors TFT1 to TFT3, which in turn are individually connected with the divided transparent electrodes E1 to E3. As a result, even if one divided portion (e.g., TFT1) has its point defected, this defect is eliminated, if viewed over the entire pixel (because the other TFT2 and TFT3 are not defective), so that the probability of the point defect can be reduced. Moreover, the defect itself can be made hard to see.

If, moreover, the divided transparent pixel electrodes E1 to E3 of the pixel are made to have substantially equal areas, it is possible to make uniform the capacity (Cpix) of the liquid crystal which is composed of the transparent pixel electrodes E1 to E3 and the common transparent pixel electrode ITO2).

Passivation Film PSV1

Over the thin film transistor TFT and the transparent pixel electrode ITO1, there is formed the passivation film PSV1, which is provided mainly for protecting the thin film transistor TFT against humidity or the like. Thus, the passivation film PSV1 to be used is highly transparent and humidity resistant. The passivation film PSV1 is formed of a silicon oxide film or silicon nitride film prepared by the plasma CVD, to have a thickness of about 8,000 angstroms.

Shielding Film BM

Figure 6:
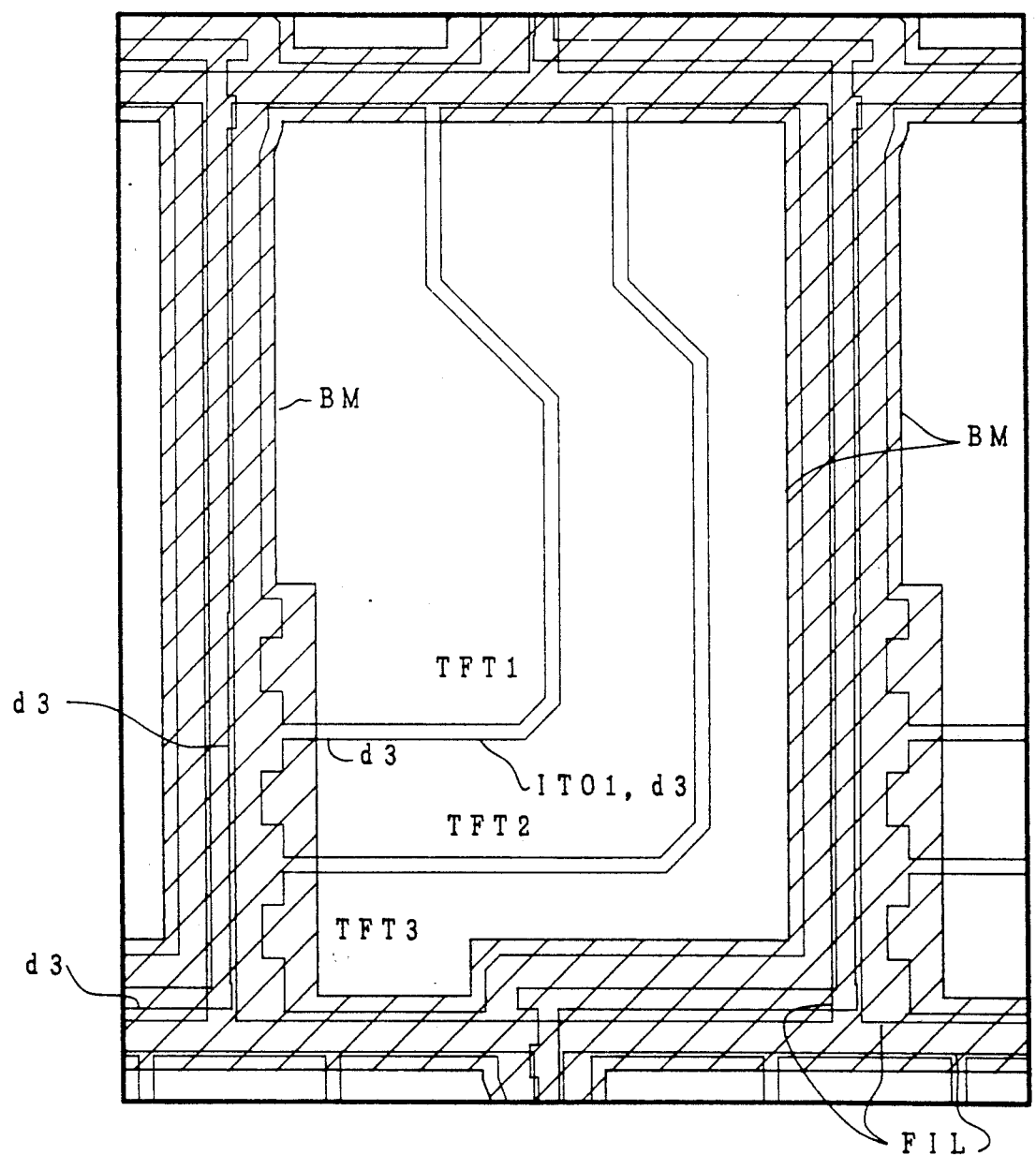

At the side of the upper substrate SUB2, there is disposed the shielding film BM for shielding any external light (i.e., the light coming from the top of FIG. 2B) from entering the i-type semiconductor layer As to be used as the channel forming region, as hatched to have the pattern shown in FIG. 6. Here, FIG. 6 is a top plan view showing only the ITO film, the layer d3, the filter layer FIL and the shielding film BM of FIG. 2A. The shielding film BM is formed of a film having a high shielding property to the light, e.g., an aluminum film or chromium film. In the present embodiment, the shielding film BM is formed of a chromium film by the sputtering, to have a thickness of about 1,300 angstroms.

As a result, the common semiconductor layer AS shared by the TFT1 to TFT3 is sandwiched between the upper shielding film BM and the lower but larger gate electrode GT so that it is shielded from the outside natural light or the back light. The shielding film BM is formed around the pixel, as hatched in FIG. 6. Specifically, the shielding film BM is formed in a lattice (of black matrix) shape, which defines the effective display region of one pixel. As a result, the contour of each pixel is clarified to improve the contrast by the shielding film BM. In other words, this shielding film BM has two functions, i.e., the shielding for the semiconductor layer AS and black matrix functions.

Incidentally, the back light may be attached to the side of SUB2, whereas the SUB1 may be disposed at the observation side (exposed to the outside).

Common Electrode ITO2

The common transparent pixel electrode ITO2 is opposed to the transparent pixel electrode ITO1, which is provided for each pixel at the side of the lower transparent glass substrate SUB1, so that the liquid crystal has its optical state varied in response to the potential difference (or electric field) between each pixel electrode ITO1 and the common pixel electrode ITO2. This common transparent pixel electrode ITO2 is fed with the common voltage Vcom. This common voltage Vcom is at an intermediate potential between a driving voltage Vdmin at the low level and a driving voltage Vdmax at the high level, both of which are applied to the video signal line DL.

Color Filter FIL

Figure 7:
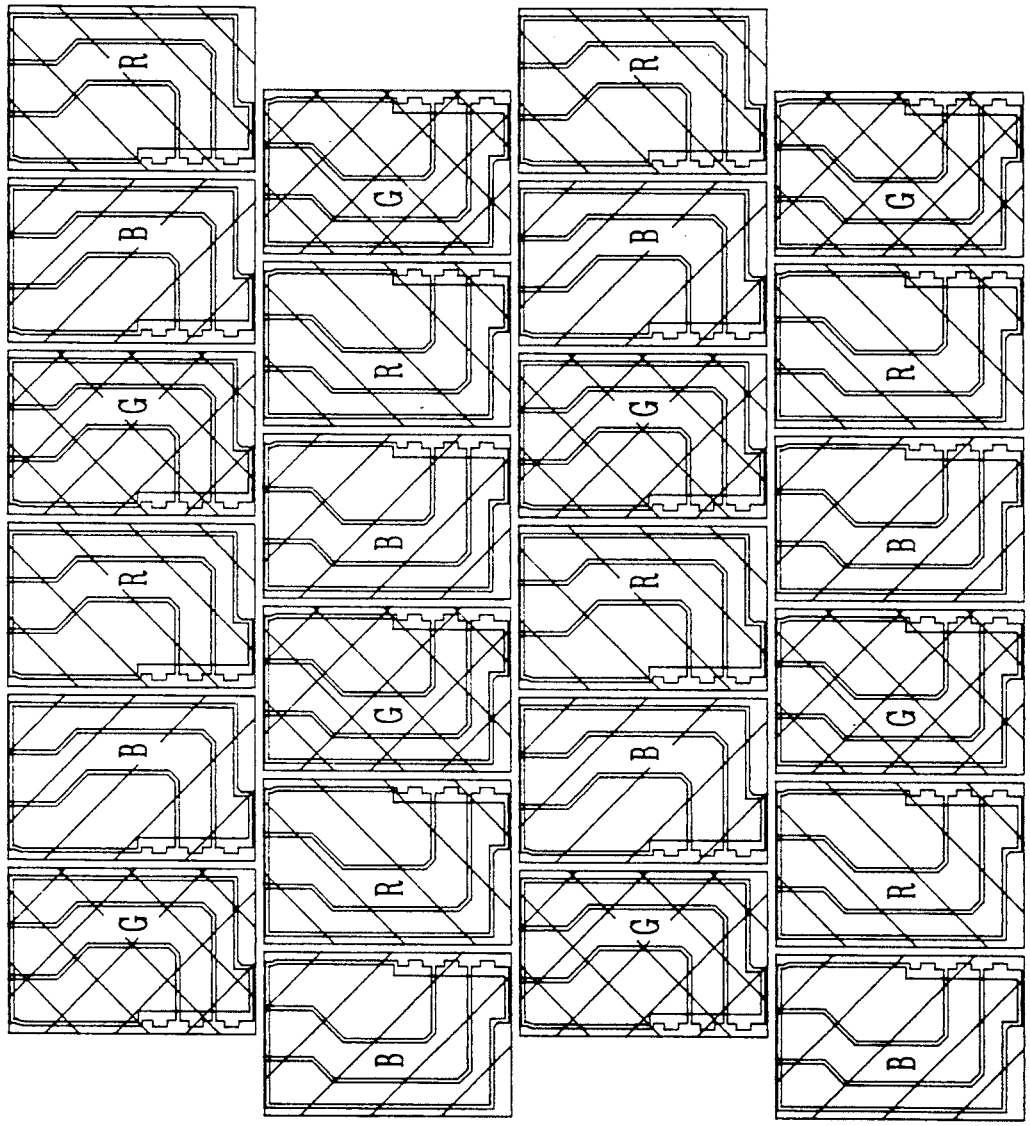
FIG. 7 is a top plan view showing an essential portion of only the pixel electrode layer and the color filter layer shown in FIG. 3.

The color filter FIL is prepared by cooling a dyeing base, which is made of a resin material such as an acrylic resin, with a dye. The color filter FIL is formed (as shown in FIG. 7) in the shape of a dot for each pixel and in a position to face the pixel. (FIG. 7 shows the third conductive film d3, the black matrix layer BM and the color filter layer FIL of FIG. 3 only, and the R, G and B filters are hatched at 45 degrees and 135 degrees and in a cloth, respectively.)

The color filter FIL is made slightly large to cover the pixel electrode ITO1 (e.g., E1 to E3) in its entirety, as shown in FIG. 6. The shielding film BM is so formed inside of the peripheral edge of the pixel electrode ITO1 as to overlap the color filter FIL and the pixel electrode ITO1.

The color filter FIL can be formed in the following manner. First of all, the dyeing base in formed on the surface of the upper transparent glass substrate SUB2, and the dyeing base other than that in the red color filter forming region is removed by the photolithographic technology. After this, the dyeing base is dyed with the red dye and fixed to form the red filter R. Next, the green filter G and blue filter B are sequentially formed by the similar steps.

Passivation Film PSV2

The passivation film PSV2 is provided for preventing the dyes for the different colors of the aforementioned color filter FIL from leaking into the liquid crystal LC. The passivation film PSV2 is made of a transparent resin material such as an acrylic resin or epoxy resin.

Pixel Arrangement

The individual pixels of the liquid crystal display unit is arranged, as shown in FIGS. 3 to 7, in plurality. In the same column direction as that, in which the scanning signal lines GL are extended, to form pixel columns X1, X2, X3, X4, - - -, and so on. The individual pixels of each of the pixel columns X1, X2, X3, X4, - - -, and so on constitute the arrangements of the thin film transistors TFT1 to TFT3 and the divided transparent pixel electrodes E1 to E3 identically.

In other words, the individual pixels of the odd pixel columns X1, X3, - - -, and so on constitute the arrangement of the thin film transistors TFT1 to TFT3 at the righthand side and the arrangement of the divided transparent pixel electrodes E1 to E3 at the lefthand side. The Individual pixels of the even pixel columns X2, X4, - - -, and so on adjacent to each other in the individual row directions of the odd pixel columns X1, X3, - - -, and so on are formed by inverting the individual pixels of the odd pixel columns X1, X3, - - -, and so on linearly symmetrically with respect to the extending direction of the video signal line DL.

In other words, the individual pixels of the pixel columns X2, X4, - - -, and so on are arranged with the thin film transistors TFT1 to TFT3 at the lefthand side and the transparent pixel electrodes E1 to E3 at the righthand side. Moreover, the individual pixels of the pixel elements X2, X4, - -, and so on are displaced (or shifted) by a half pixel pitch in the column direction from the individual pixels of the pixel columns X1, X3, - - -, and so on.

If each pixel pitch of the pixel column X is set to 1.0 (i.e., 1.0 pitch), the pixel column X at a succeeding stage is shifted at 0.5 pixel pitch in the column direction from the pixel column X at the preceding stage. The video signal line DL extending between the individual pixels in the row direction is extended between the individual pixel columns X by a half pixel pitch (i.e., 0.5 pitch) in the column direction.

As a result, as shown in FIG. 7, the pixels formed with a predetermined color filter of the pixel column X at the preceding stage (e.g., the pixels formed with a red color filter R of the pixel column X3) and the pixels formed with an identical color film of the pixel column X at the succeeding stage (e.g., the pixels formed with the red color filter R of the pixel column X4) are spaced by 1.5 pixel pitch, and the color filter FIL of RGB takes a triangular arrangement. Since this triangular arrangement structure of RGB of the color filter FIL can improve the mixing of the individual colors, it is possible to improve the resolution of a color image.

Moreover, the video signal line DL extends by only one pixel pitch in the column direction between the individual pixel columns so that it does not intersect the adjacent ones DL. This makes it possible to eliminate the leading-around of the video signal lines DL thereby to reduce the area occupied by them and to eliminate the bypass of the video signal lines DL thereby to abolish the multi-layered wiring structure.

Equivalent Circuit of Whole Display Circuit

Figure 8:
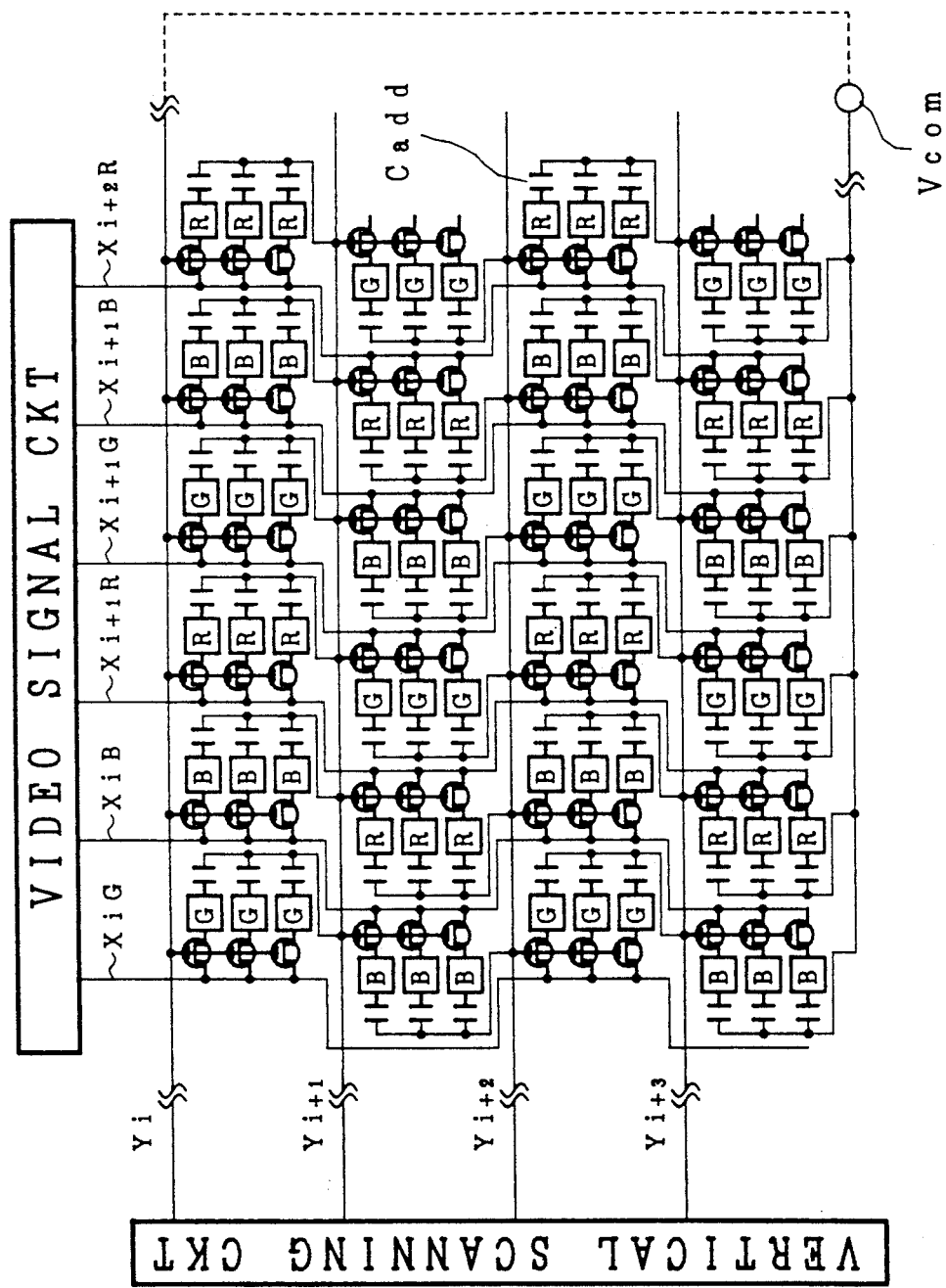
FIG. 8 is an equivalent circuit diagram showing the liquid crystal display unit of the color liquid crystal display circuit of active matrix.

An equivalent circuit of this liquid crystal display circuit is shown in FIG. 8. Reference letters designate $X_iG$, $X_{i+1}G$, - - -, and so on designate the video signal lines DL which are connected with the pixels to be formed with a green filter G. Letters $X_iB$, $X_{i+1}B$, - - -, and so on designate the video signal lines DL which are connected with the pixels to be formed with a blue filter B. Letters $X_iR$, $X_{i+1}R$, - -, and so on designate the video signal lines DL which are connected with the pixels to be formed with a red filter R.

These video signal lines DL are selected by a video signal drive circuit. Letters $Y_i$ designate the scanning signal lines GL for selecting the pixel column X1 shown in FIGS. 3 and 7. Likewise, letters $Y_{i+1}$, $Y_{i+2}$, - - -, and so on designate the scanning signal lines GL for selecting the pixel columns X2, X3, - - -, and so on, respectively. These signal lines GL are connected with the vertical scanning circuit.

Structure of Additional Capacitor Cadd

Each of the transparent pixel electrodes E1 to E3 is formed like an L-shape to overlap the adjoining scanning signal line GL at the end opposite to the end to be connected with the thin film transistor TFT. This superposition constitutes a latching capacity element (or electrostatic capacity element) Cadd which uses each of the transparent pixel electrodes E1 to E3 as its one electrode PL1 and the adjoining scanning signal line GL as its other electrode PL2, as is apparent from FIG. 2C. This latching capacity element Cadd has its dielectric film formed of the same layer as that of the insulating film GI to be used as the gate insulating film of the thin film TFT.

The latching capacitor Cadd is formed in the widened portion of the first layer g1 of the gate line GL, as is apparent from FIG. 4. Here, the layer g1 at the portion intersecting the drain line DL is thinned to reduce the probability of the short-circuiting with the drain line.

A portion between each of the transparent pixel electrodes E1 to E3 and the capacity electrode line (g1) to be superposed to constitute the latching capacity Cadd is partially formed like the aforementioned source electrode SD1 with the island region, in which the first conductive film d1 and the second conductive film d2 is formed, so that the transparent pixel electrode ITO1 may not be broken when it rides over the stepped shape. The island region is made as small as possible so that the area (or opening percentage) of the transparent pixel electrode ITO1 may not drop.

Equivalent Circuit of Additional Capacitor Cadd and its Operations

Figure 9:
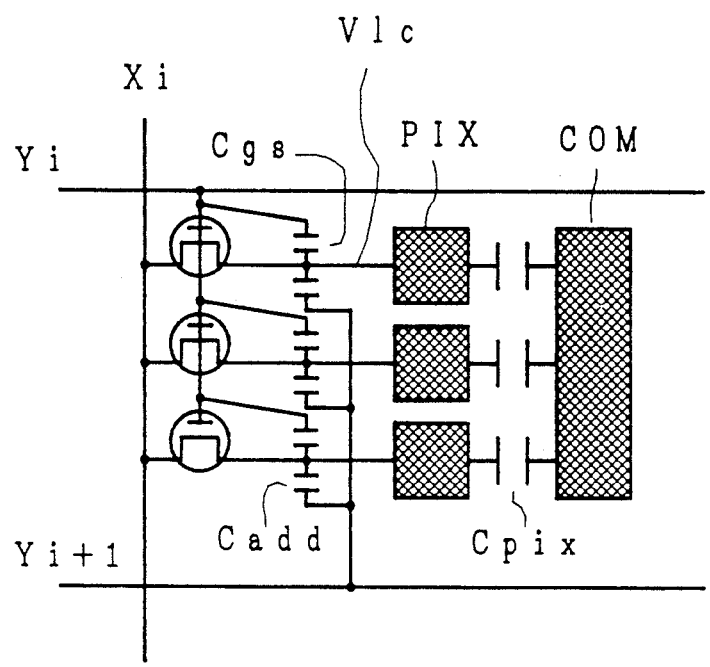
FIG. 9 is an equivalent circuit diagram of the pixels shown in FIG. 2A.

The equivalent circuit of the pixel shown in FIG. 2A is shown in FIG. 9. In FIG. 9, letters Cgs designate a parasitic capacitor to be formed between the gate electrode GT and the source electrode SD1 of the thin film transistor TFT. The parasitic capacitor Cgs has its dielectric film made of the insulating film GI. Letters Cpix designate a liquid crystal capacitor to be formed between the transparent pixel electrode ITO1 (or PIX) and the common transparent pixel electrode ITO2 (or COM). The dielectric film of the liquid capacitor Cpix is formed of the liquid crystal LC, the passivation film PSV1 and the alignment films ORI1 and ORI2. Letters Vlc designate a mid point potential.

The aforementioned latching capacity element Cadd functions to reduce the influences of the gate potential variation "delta" Vg upon the center potential (e.g., the pixel electrode potential) Vlc when the TFT switches, as expressed by the following formula:

"delta" Vlc = {Cgs / (Cgs − Cadd − Cpix)} X "delta" Vg.

wherein "delta" Vlc designates the variation of the central potential due to "delta" Vg.

This variation "delta" Vlc causes the DC component to be added to the liquid crystal and can be reduced the more for the higher latching capacitor Cadd.

Moreover, the latching capacitor Cadd functions to elongate the discharge time and stores the video information for a long time after the TFT is turned off. The DC component to be applied to the liquid crystal LC can improve the lifetime of the liquid crystal LC, if reduced, to reduce the so-called "printing", by which the preceding image is left at the time of switching the liquid crystal display frame.

Since the gate electrode GT is enlarged to such an extent as to cover the semiconductor layer AS completely, as has been described hereinbefore, the overlapped area with the source/drain electrodes SD1 and SD2 is increased to cause an adverse effect that the parasitic capacity Cgs is increased to make the center potential Vlc liable to be influenced by the gate ((scanning) signal Vg. However, this demerit can be eliminated by providing the latching capacitor Cadd.

The latching capacity of the aforementioned latching capacity element Cadd is set from the pixel writing characteristics to a level four to eight times as large as that of the liquid crystal capacity Cpix (4Cpix < Cadd < 8Cpix) and eight to thirty two times as large as that of the superposed capacity Cgs (8Cgs < Cadd < 32Cgs).

Method of Connecting Electrode Line of Additional Capacitor Cadd

The initial state scanning signal line GL (i.e., Yo) to be used only as the capacity electrode line is connected with the common transparent pixel electrode (Vcom) ITO2, as shown in FIG. 8. The common transparent pixel electrode ITO2 is connected with a leading-out line in the peripheral edge of the liquid crystal display circuit by means of a silver paste SL, as shown in FIG. 2B. Moreover, this leading-out line has its partial conductive layer (g1 or g2) prepared at the same step as that of the scanning signal line GL. As a result, the final stage capacity electrode line GL can be easily connected with the common transparent pixel electrode ITO2.

Alternatively, the scanning signal line (or capacity electrode line) GL at the final stage (or the initial stage) may be connected with the scanning signal line GL of the initial stage (or the final stage). Incidentally, this connection can be accomplished by either the internal line in the liquid crystal display circuit or the external leading-out line.

Offset of DC Component by Scanning Signal of Latching Capacity Element

Figure 10:
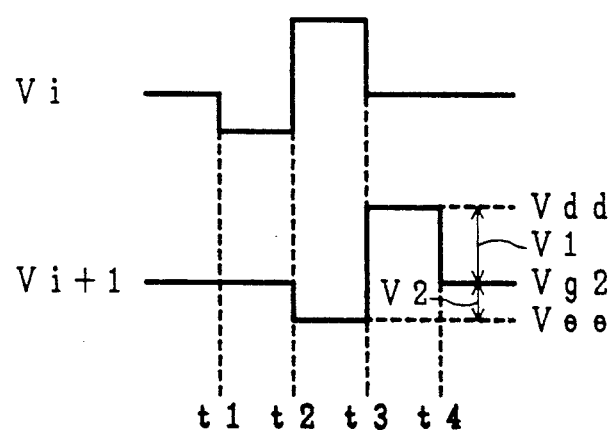
FIG. 10 is a time chart showing the drive voltages of the scanning signal lines according to the DC offset method.

This liquid crystal display circuit can further reduce the DC component to be applied to the liquid crystal LC, by controlling the drive voltage of the scanning signal line GL, as shown in FIG. 10 (or a time chart), on the basis of the DC offset method (or DC canceling method) disclosed in Japanese Patent Laid-Open No. 95125/1987 filed by us.

In FIG. 10, letters Vi designate the drive voltage of an arbitrary scanning signal line GL, and letters Vi+1 designate the drive voltage of the scanning signal line GL at the succeeding step. Letters Vee designate a low-level drive voltage Vdmin to be applied to the video signal line DL, and letters Vdd designate a high-level drive voltage Vdmax to be applied to the video signal line DL.

The voltage changes "delta" V1 to "delta" V4 of a mid point potential Vlc (as shown in FIG. 9) at individual times t = t1 to t4 are expressed by the following formulas for the total capacity of the pixels of C = Cgs + Cpix + Cadd:

"delta"V1 = −(Cgs/C) X V2;

"delta"V2 = −(Cgs/C) X (V1 − V2) − (Cadd/C) X V2;

"delta"V3 = −(Cgs/C) X V1 − (Cadd/C) X (V1 − V2); and

"delta"V4 = −(Cadd/C) X V1.

Here, the DC voltage to be applied to the liquid crystal LC is expressed by the following formula, if the drive voltage to be applied to the scanning signal line GL is sufficient (as will be referred to the following [Note]):

"delta" V3 + "delta" = (Cadd × V2 − Cgs X V1)/C.

Hence, the DC voltage to be applied to the liquid crystal LC is 0 if Cadd × V2 = Cgs X V1.

[Note] At times t1 and t2, the changing component of the drive voltage Vi exerts influences upon the mid point potential Vlc, which is set to the same potential (sufficient for writing the video signals) as the video signal potential through the signal line Xi for the time period from t2 to t3. The potential to be applied to the liquid crystal LC is substantially determined (so that the thin film transistor TFT may have a far longer OFF period than the ON period) by the potential immediately after the thin film transistor TFT has been turned off.

For calculating the DC component to be applied to the liquid crystal LC, therefore, the periods from t1 to t3 can be substantially neglected, and it is sufficient to consider the influences the potential immediately after the thin film transistor TFT has been turned off, i.e., the influences at the transitions of the times t3 and t4. Incidentally, the video signals have their polarity inverted for each frame or line so that their own DC components are reduced to zero.

In short, the DC offset method is enabled to minimize the DC components to be applied to the liquid crystal LC, by compensating the drop due to the leading-in the mid point potential Vlc by the parasitic capacity Cgs by the drive voltage to be applied to the latching capacity element Cadd and the scanning line GL of the scanning signal line (or the capacity electrode line) GL at the succeeding stage.

As a result, the liquid crystal display circuit can elongate the lifetime of the liquid crystal LC. In case the gate electrode GT is enlarged to enhance the shielding effect, the latching capacity of the latching capacity element Cadd may naturally be increased.

Modified Embodiments

Figure 1B:
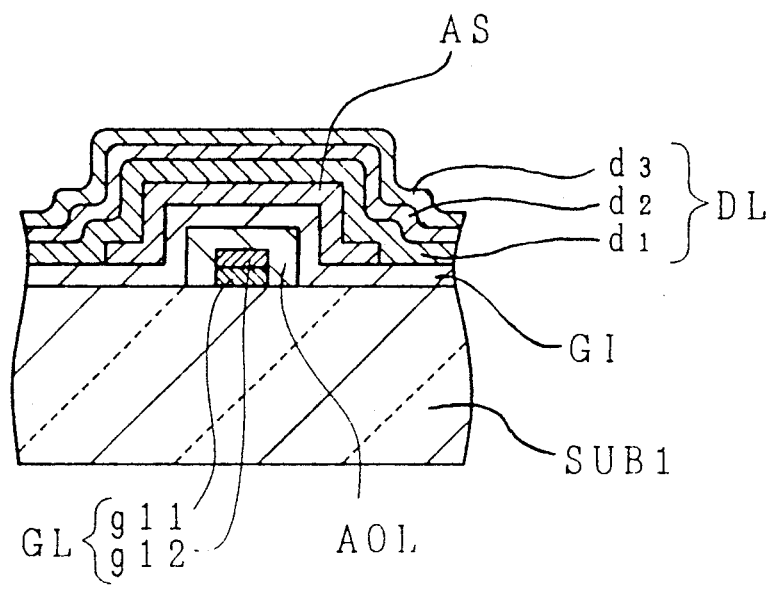
FIG. 1B is a section taken along line 1B—1B from FIG. 1D.
Figure 1C:
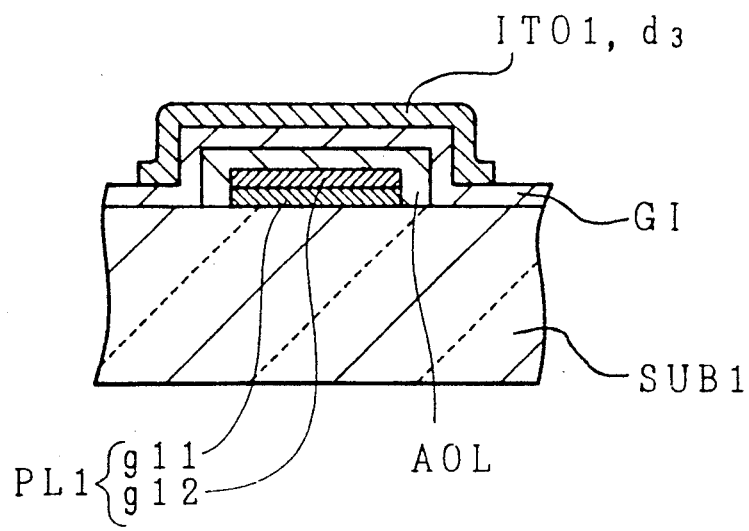
FIG. 1C is a section taken along line 1C—1C from FIG. 1D.
Figure 1D:
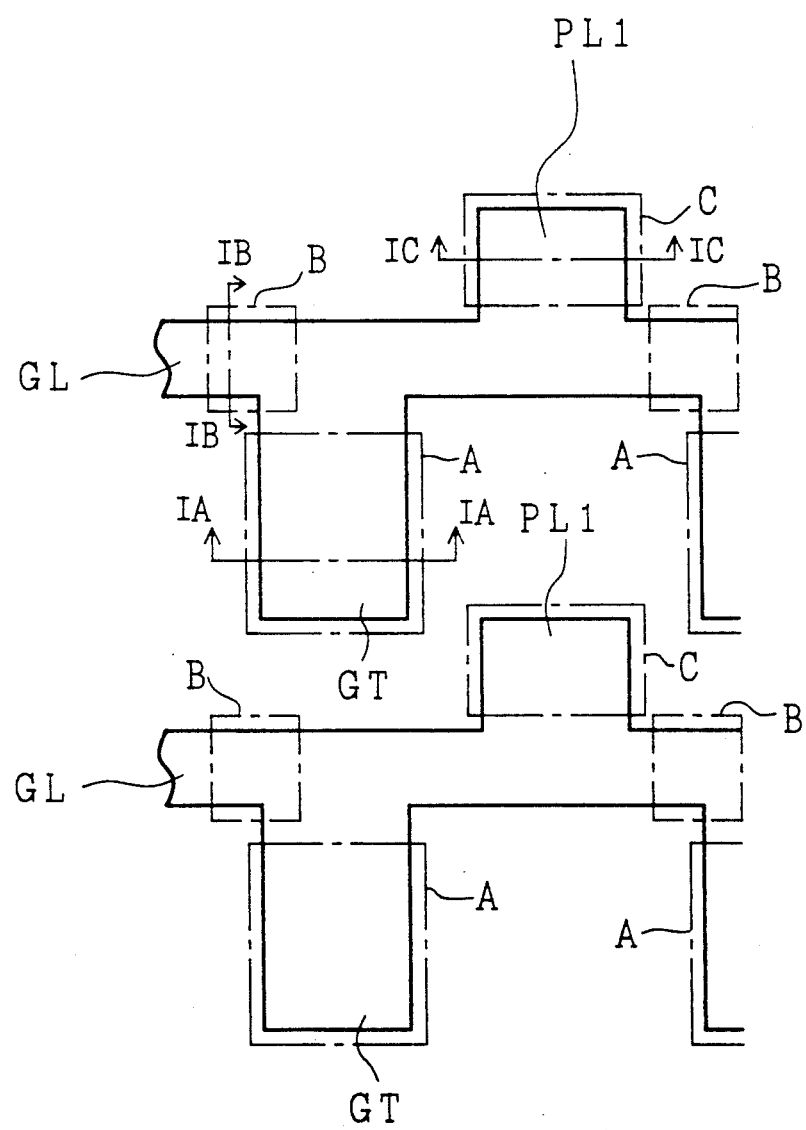
FIG. 1D is a diagram showing the gate electrode and so on of the thin film transistor of the color liquid crystal display circuit of active matrix type according to the present invention.

FIG. 1D is a diagram showing the gate electrodes and so on of the thin film transistor of the color liquid crystal display circuit of active matrix type according to the present invention; FIG. 1A is a section taken along line 1A—1A of FIG. 1D; FIG. 1B is a section taken along line 1B—1B of FIG. 1D; and FIG. 1C is a section taken along line 1C—1C of FIG. 1D.

In these FIGS., reference characters g11 designate a tantalum film formed over a lower transparent substrate SUB1, and characters g12 designate an aluminum film formed over the tantalum film g11. These tantalum film g11 and aluminum film g12 constitute the scanning signal lines GL, the gate electrodes GT, and the electrodes PL1 of the latching capacity element Cadd.

Letters AOL designate an anodized aluminum film (Al$_2$O$_3$) formed over the aluminum film g12. This anodized film AOL is formed over the gate electrodes GT (as indicated at A in FIG. 1D), the intersections (as indicated at B in FIG. 1D) of the scanning signal lines GL with the video signal lines DL, and the electrodes PL1 (as indicated at C in FIG. 1D).

In this thin film transistor, the adhesion of the tantalum film g11 to the lower transparent glass substrate SUB1 is superior to that of aluminum or the like so that the gate electrodes GT can be prevented from damages or slippages to improve the reliability and production yield. Since, moreover, the breakdown voltage of the anodized aluminum film AOL is higher than that of Ta$_2$O$_3$ or the like, it is possible to prevent the short circuit among the gate electrodes GT, the source electrodes SD1 and the drain electrodes SD2 and to reduce the leakage currents among the same. Still moreover, the scanning signal lines GL are composed of the tantalum film g11 and the aluminum film g12.

Since the aluminum has a low specific resistance, the scanning signal lines GL have a low resistance so that the signals can be reliably written. Furthermore, the anodized film AOL is formed at the intersections of the scanning signal lines GL with the video signals lines DL so that the scanning signal lines GL and the video signal lines DL can be prevented from being shorted.

Furthermore, the anodized film AOL has a specific dielectric constant of 9.2, and the silicon nitride film has a specific dielectric constant of 6.7, so that the anodized film AOL has a specific dielectric constant higher by 37% than that of the silicon nitride film. As a result, the mutual inductance gm of the thin film transistor TFT can be improved, and the electrodes PL1 can have their areas reduced to improve the opening efficiency.

If, on the other hand, the aluminum film is overlaid by the tantalum film and patterned together, as in the thin film transistor of the prior art, the side etching of the underlying aluminum film is increased to allow the overlying tantalum film to be peeled at its end portions.

In the thin film transistor of the present invention, on the other hand, the aluminum film g12 is formed over the tantalum film g11. As a result, the upper aluminum film g12 will not be peeled, even if the side etching of the aluminum film g12 is large when the tantalum film g11 and the aluminum film g12 are simultaneously patterned.

Next, the process for manufacturing the thin film transistor will be described with reference to FIGS. 1A to 1D.

First of all, the lower transparent glass substrate SUB1 is continuously formed by the sputtering with the tantalum film g11 and the aluminum film g12 having a thickness of 2,300 angstroms.

The tantalum film g11 and the aluminum film g12 are selectively etched to form the scanning signal lines GL, the gate electrodes GT, the terminals, the electrodes PL1, and the gate wiring bus lines connected with the scanning signal lines GL. Next, a resist having a thickness of 3.0 micrometers is applied, and the resist is removed at the portions A to C of FIG. 1D.

Next, the lower transparent glass substrate SUB1 is dipped in the anodizing liquid, and the gate wiring bus lines are supplied with a voltage of 144 [V]. After about 30 minutes, the aluminum film g12 of 1,300 angstroms is oxidized to form the anodized film AOL having a thickness of about 2,000 angstroms.

In this case, the anodizing liquid to be used is exemplified by a solution which is prepared by diluting a solution of tartaric acid of 3% with ethylene glycol or propylene glycol and by adding ammonia water to adjust the pH value to 7.0 ±0.5.

Next, the resist is removed, and a heat treatment is accomplished in the atmosphere or under a vacuum at 200 to 400 [°C] for 60 minutes.

Next, a silicon nitride film having a thickness of 3,500 angstroms and an i-type amorphous silicon film having a thickness of 2,100 angstroms are formed, followed by an N$^+$-type silicon film having a thickness of 300 angstroms.

Next, an i-type semiconductor layer AS is formed by etching the N$^+$-type silicon film and the i-type amorphous silicon film selectively.

Next, the insulating film GI is formed by etching the silicon nitride film selectively. Next, a first conductive film d1 of chromium having a thickness of 600 angstroms is formed by the sputtering.

Next, a first layer of the video signal lines DL, the source electrode SD1 and the drain electrode SD2 is formed by etching the first conductive film d1 selectively.

Next, an N$^+$-type semiconductor layer d0 is formed by etching the N$^+$-type silicon film selectively before removing the resist.

Next, a second conductive film d2 having a thickness of 3,500 angstroms and made of aluminum-palladium, aluminum-silicon-titanium, aluminum-silicon-copper or the like is formed by the sputtering.

Next, the second conductive film d2 is selectively etched to form a second layer of the video signal lines DL, the source electrode SD1 and the drain electrode SD2. In this case, the gate wiring bus lines are eliminated.

Next, a third conductive film d3 of ITO having a thickness of 1,200 angstroms is formed by the sputtering.

Next, the third conductive film d3 is selectively etched to form a third layer of the video signal lines DL, the source electrode SD1 and the drain electrode SD2, the uppermost layer of the gate electrode and the drain electrode, and a transparent pixel electrode ITO1.

Next, a silicon nitride silicon film having a thickness of 1 micro-meter is formed.

Next, the silicon nitride film is selectively etched to form a passivation film PSV1.

In this process for manufacturing the thin film transistor, the anodizing liquid used is prepared by diluting a solution of tartaric acid of 3% with ethylene glycol or propylene glycol and by adding ammonia water to adjust the pH value to 7.0 ±0.5.

Thus, the anodized film AOL has remarkably excellent breakdown voltage and leakage characteristics. Specifically, if the aqueous solution of tartaric acid having a concentration of several percentages is mainly used as the anodizing liquid in case the anodized film AOL is to be formed, the breakdown voltage and leakage characteristics of the anodized film AOL are seriously deteriorated, as indicated by curve 11 in FIG. 1E.

Figure 1E:
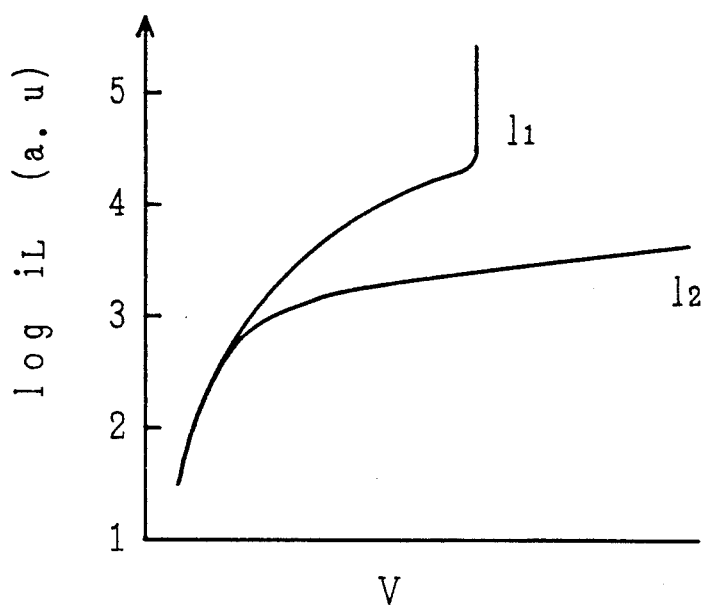
FIG. 1E s a graph showing the relations between the voltage applied to the anodized film AOL and the leakage currents.

If, however, the anodizing liquid used is prepared by diluting tartaric acid with ethylene glycol or propylene glycol, the breakdown voltage and leakage characteristics of the anodized film AOL are remarkably excellent, as indicated by curve 12 in FIG. 1E.

Figure 1F:
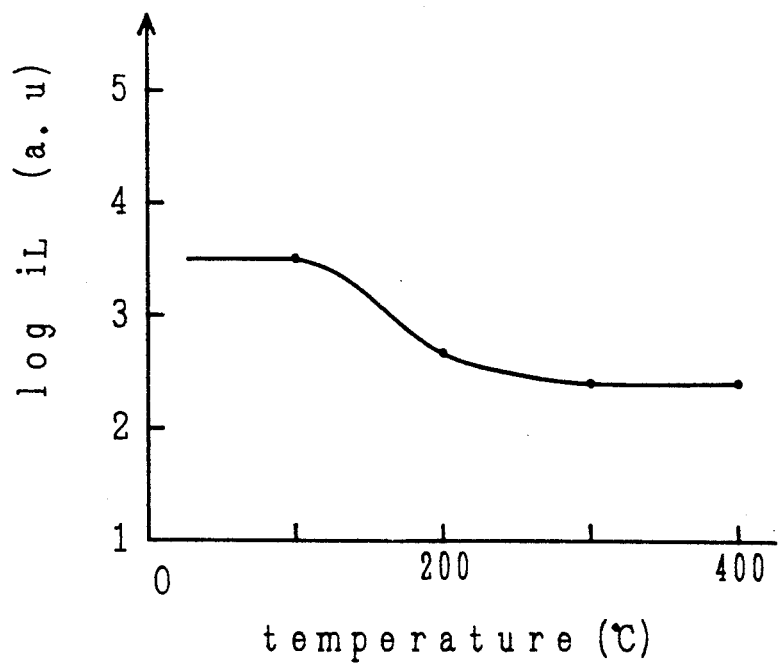
FIG. 1F is a graph showing the relation between the temperature of heat treatment after the anodized film AOL has been formed and the leakage current.

On the other hand, FIG. 1F presents a graph plotting the leakage current against the temperature of the heat treatment after the anodized film AOL has been formed. As is apparent from this graph, the heat treatment temperature is desirably at 200 to 400 [C], and a higher temperature might cause the peeling of the aluminum film g12.

Although our invention has been specifically described on the basis of the foregoing embodiments, it should not be limited thereto but can naturally be modified in various manners without departing the gist thereof.

In the foregoing embodiments, for example, the electrode PL1 is connected with the adjacent scanning signal lines GL, but the latching capacity element Cadd need not be provided, but the electrode PL1 may be connected with the scanning signal lines GL at the succeeding stage.

In the aforementioned embodiments, moreover, the scanning signal lines GL, the gate electrode GT and the electrode PL1 are formed of the tantalum film g11 and the aluminum film g12 but may be formed of the tantalum film g11 and a metal film composed mainly of aluminum, e.g., an aluminum-silicon film or an aluminum-palladium film.

In the foregoing embodiments, still moreover, the aluminum film g12 is partially anodized but may be anodized all over its surface. In the foregoing embodiments, furthermore, the aluminum film g12 is partially anodized. After the scanning signal lines GL have been formed, however, the whole surface may be formed with the aluminum film, and this aluminum film may be anodized all over its surface, followed by forming the insulating film GI. In this case, it is possible to reduce the step among the scanning signal lines GL, the gate electrode GT and the electrode PL1.

In the foregoing embodiments, furthermore, the anodized film AOL is formed thereover with the insulating film GI made of silicon nitride but may be formed thereover with an insulating film of silicon oxide (SiO$_2$).

In the foregoing embodiments, furthermore, the insulating film GI is formed over the anodized film AOL at the intersections of the scanning signal lines GL with the video signal lines DL and at the electrode PL1 but may not be formed thereover.

Figure 1G:
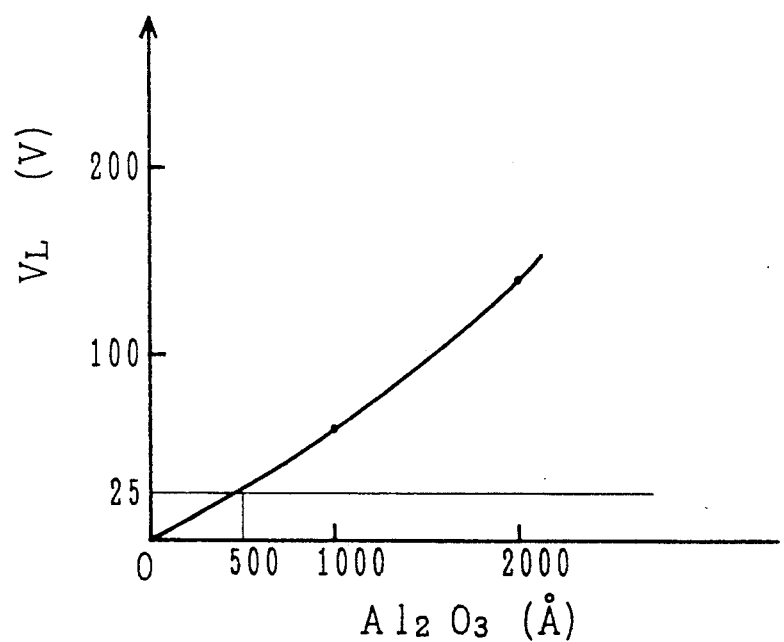
FIG. 1G is a graph showing the relation between the thickness of the anodized film AOL and the breakdown voltage VL.
Figure 1H:
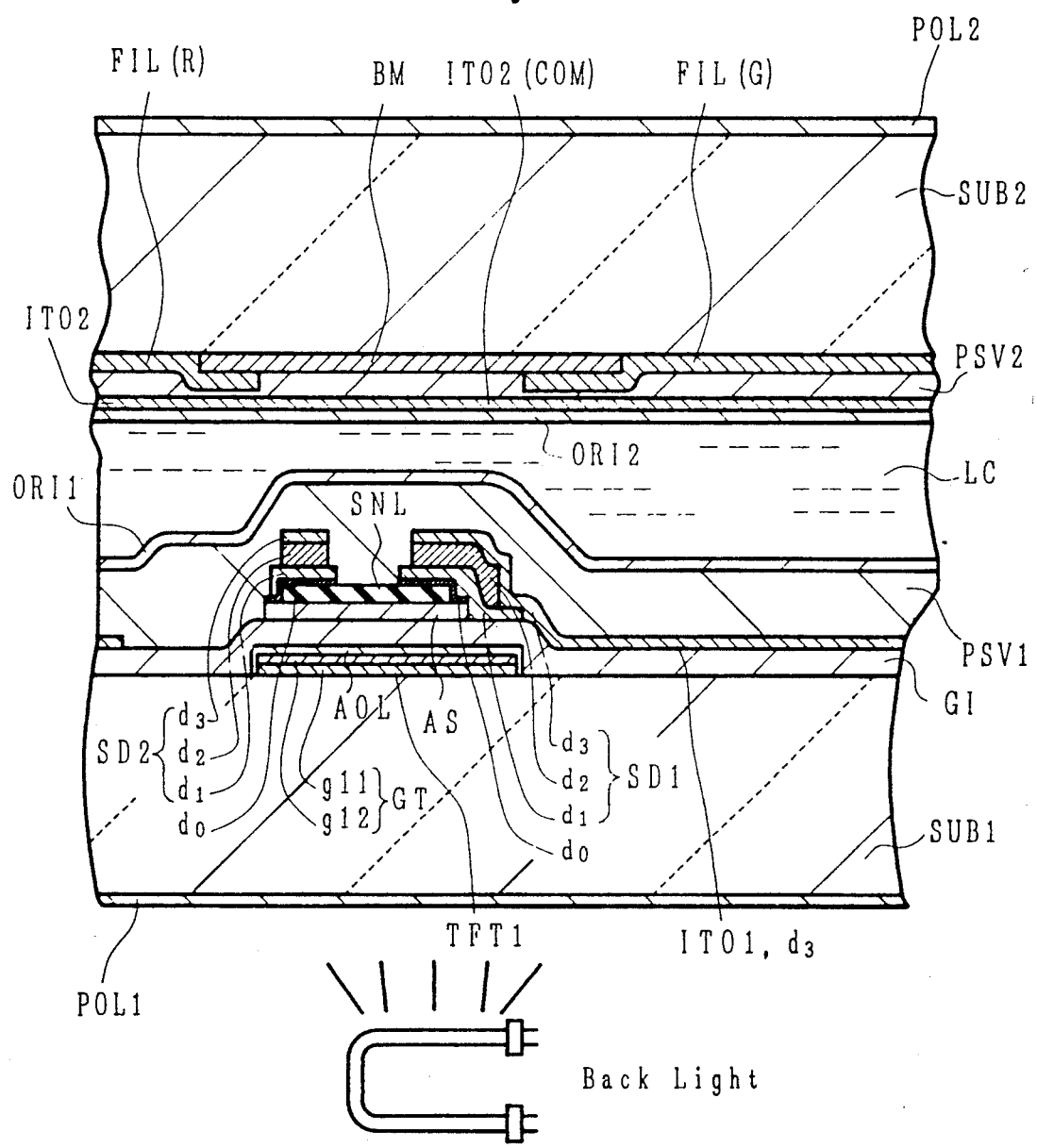
FIG. 1H is a section showing the thin film transistor of another color liquid crystal display circuit of active matrix type according to the present invention.

In the foregoing embodiments, furthermore, the i-type semiconductor layer AS made of the amorphous silicon film or the polycrystalline silicon film is used as the active layer of the thin film transistor TFT but may be replaced by a tellurium (Te) film or the like. On the other hand, FIG. 1G presents a graph plotting the breakdown voltage VL the film thickness of the anodized film AOL against. Since a voltage of about 25 [V] at the maximum is applied between the gate electrode GT and the drain electrode SD2 and since pin holes may possibly be formed in the insulating film GI, the thickness of the anodized film AOL may desirably be set to 500 angstroms or more.

In the foregoing embodiments, furthermore, the i-type semiconductor layer AS is formed thereover directly with the N$^+$-type semiconductor layer d0 but may be formed thereover with the N$^+$-type semiconductor layer d0 through the silicon nitride film SNL.

In the foregoing embodiments, furthermore, the scanning signal lines GL and so on are formed by forming the tantalum film g11 and the aluminum film g12 continuously by the sputtering and by etching the tantalum film g11 and the aluminum film g12 selectively. However, the scanning signal lines GL and so on may be formed by forming the tantalum film g11 by the sputtering, by etching the tantalum film g11 selectively, by forming the aluminum film g12 by the sputtering and by etching the aluminum film g12 selectively.

In the foregoing embodiments, furthermore, the aluminum film g12 at the terminals are kept away from being anodized, but the anodized aluminum film at the terminals may be removed after it has been anodized to have its terminals exposed by patterning the insulating film GI and before the resist has been removed.

Furthermore, the scanning signal lines GL, the gate electrode GT and the electrodes PL1 may be formed by forming a tantalum film over the lower transparent glass substrate SUB1 by the sputtering, by etching the tantalum film selectively to form an anodization preventing resist pattern, by forming an anodized tantalum film at the gate electrodes GT, the intersections of the scanning signal lines GL with the video signal lines DL, and the electrodes PL1, by forming an aluminum film by the sputtering, by etching the aluminum film selectively to form the aluminum film over the tantalum film and the anodized tantalum film at the portions excepting the intersections of the scanning signal lines GL with the video signal lines DL.

In the thin film transistor according to the present invention, as has been described hereinbefore, the adhesion of the tantalum to the glass substrate is so excellent that the gate electrodes are freed from being damaged, and the aluminum oxide has such a high breakdown voltage that the gate electrode, the source electrode and the drain electrode are prevented from being shorted. Thus, the present invention can enjoy prominent effects.

What is claimed is:

1. A thin-film transistor comprising:
a substrate;

a gate electrode including a first-level conducting film of tantalum formed on said substrate and a second-level conducting film of aluminum formed over said first-level layer;

a gate insulating film formed on said second-level conducting film including a third-level insulating film formed of an oxidized film of said secondlevel conducting film;

a semiconductor film formed over said gate insulating film; and a pair of source and drain electrodes formed apart from each other over said semiconductor film so that said gate electrode is laid across among said pair.

2. The thin-film transistors according to claim 1, wherein said gate insulating film further includes a fourth-level insulating film, of different material from said oxidized film, formed between said third-level insulating film and said semiconductor film.

3. The thin-film transistor according to claim 2, wherein said oxidized film is an anodized film of said second-level conducting film, said fourth-level insulating film is comprised of silicon nitride and said semiconductor film is comprised of silicon.

4. A liquid crystal display device comprising:

a first substrate and a second substrate;

a liquid crystal layer formed between said first and second substrates;

a plurality of thin-film transistors formed between said first substrate and said liquid crystal layer each including a gate electrode, a semiconductor film, a gate insulating film formed between said semiconductor film and said gate electrode and source and drain electrodes formed apart form each other;

a plurality of pixel electrodes each electrically connected with one of said source and drain electrodes of each of said thin-film transistors;

a plurality of row conducting lines each electrically connected with each said gate electrode of associated thin-film transistors;

a plurality of column conducting lines each electrically connected with the other one of said source and drain electrodes of said associated thin-film transistors;

a first-level conducting film comprised of tantalum formed on said first substrate;

a second-level conducting film comprised of aluminum formed over said first-level conducting film, wherein said first-level conducting film and said second-level conducting film together comprise said gate electrodes and said two conducting lines; and a third-level insulating film being of an oxidized film and formed on the upper surface of said second-level conducting film providing said gate insulating film and an intersection insulator between each of said row conducting lines and each of said column conducting lines at the intersection thereof.

5. The liquid crystal display device according to claim 4, wherein said gate insulating film and said intersection insulator further include a fourth-level insulating film formed over said third-level insulating film and comprised of different material therefrom.

6. The thin-film transistor according to claim 3, wherein said substrate is a transparent glass substrate, and wherein said semiconductor film is an i-type amorphous Si semiconductor layer.

7. The thin-film transistor according to claim 1, wherein said substrate is a transparent glass substrate, and wherein said semiconductor film is an i-type amorphous Si semiconductor layer.

8. The thin-film transistor according to claim 3, wherein said substrate is a transparent glass substrate, and wherein said semiconductor film is a polycrystalline silicon film.

9. The tin-film transistor according to claim 1, wherein said substrate is a transparent glass substrate, and wherein said semiconductor film is a polycrystalline silicon film.

10. The liquid crystal display device according to claim 5, wherein said first and second substrates are transparent glass substrates, and wherein said semiconductor film is an i-type amorphous Si semiconductor layer.

11. The liquid crystal display device according to claim 4, wherein said first and second substrates are transparent glass substrate, and wherein said semiconductor film is an i-type amorphous Si semiconductor layer.

12. The liquid crystal display device according to claim 5, wherein said first and second substrates are transparent glass substrates, and wherein said semiconductor film is a polycrystalline silicon film.

13. The liquid crystal display device according to claim 4, wherein said first and second substrates are transparent glass substrates, and wherein said semiconductor film is a polycrystalline silicon film.

* * * * *